(12) United States Patent
Huang et al.

(10) Patent No.: US 6,187,103 B1
(45) Date of Patent: Feb. 13, 2001

(54) APPARATUS AND METHOD FOR TRANSPORTING WAFERS

(75) Inventors: C. Y. Huang, Hsin-Chu; T. H. Ding, Lu-Chai, both of (TW)

(73) Assignee: Taiwan Semiconductor Manufacturing Company, Ltd., Hsin Chu (TW)

( * ) Notice: Under 35 U.S.C. 154(b), the term of this patent shall be extended for 0 days.

(21) Appl. No.: 09/141,066

(22) Filed: Aug. 27, 1998

(51) Int. Cl.[7] .................................................... C23C 16/00

(52) U.S. Cl. ...................... 118/728; 414/935; 414/941; 118/715

(58) Field of Search ..................................... 414/935, 941; 901/30; 156/345; 118/728, 715

(56) References Cited

U.S. PATENT DOCUMENTS

| 5,531,835 | * | 7/1996 | Fodor et al. | 118/728 |
| 5,746,460 | * | 5/1998 | Marohl et al. | 294/1.1 |
| 5,976,199 | * | 11/1999 | Wu et al. | 29/25.01 |

* cited by examiner

Primary Examiner—Timothy Meeks
Assistant Examiner—Norca L. Torres
(74) Attorney, Agent, or Firm—Tung & Associates

(57) ABSTRACT

An apparatus and a method for transporting wafers into a process chamber are disclosed. The wafer-transporting blade for transporting wafers consists of a generally elongated blade member that has a top surface for engaging and holding a wafer positioned thereon, wherein at least a portion of the top surface is provided with a surface roughness sufficiently great to frictionally engaging a wafer positioned thereon without slippage. The surface roughness may be provided by either a mechanical or a chemical method.

17 Claims, 3 Drawing Sheets

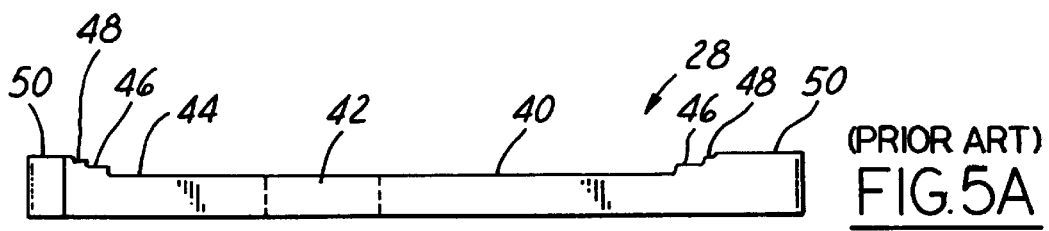
(PRIOR ART) FIG.5A
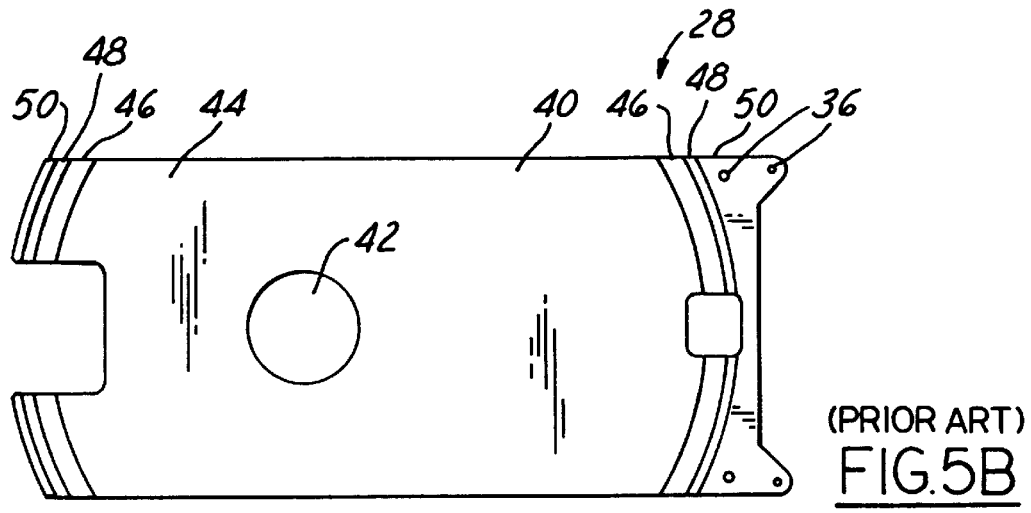
(PRIOR ART) FIG.5B
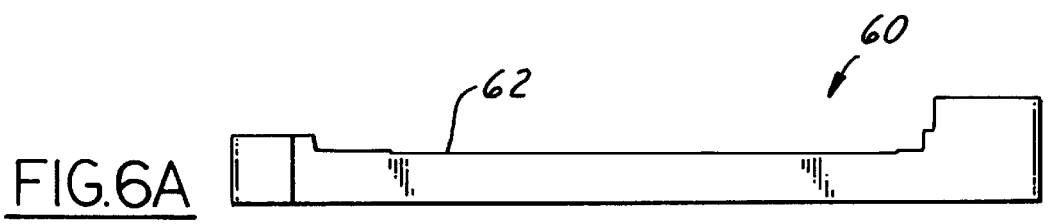
FIG.6A
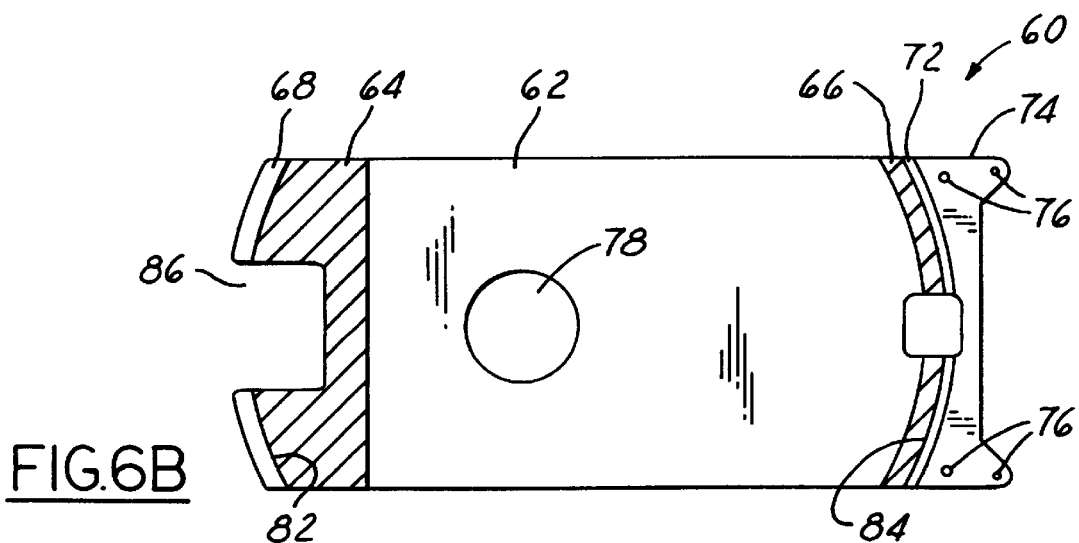
FIG.6B

APPARATUS AND METHOD FOR TRANSPORTING WAFERS

FIELD OF THE INVENTION

The present invention generally relates to an apparatus and a method for transporting a semiconductor substrate and more particularly, relates to an apparatus and a method for transporting wafers wherein the apparatus is a quartz robot blade which has a top surface provided with at least partially a surface roughness sufficiently great to prevent a wafer positioned thereon from slipping off.

BACKGROUND OF THE INVENTION

In the fabrication processes for a semiconductor device, numerous processing steps must be carried out on a semiconducting substrate before the device is fabricated. The numerous processes may be as many as several hundred processing steps. Each processing step is executed in a process chamber such as an etcher, a physical vapor deposition chamber (or a sputter), a chemical vapor deposition chamber, etc.

In the vast majority of the processing steps, a special environment of either a high vacuum, a low vacuum, a gas plasma or other chemical environment must be provided for the wafer. For instance, in a sputter chamber, a high vacuum environment must first be provided surrounding the wafer such that metal particles sputtered from a metal target can travel to and deposit on an exposed surface of the wafer. In other process chambers, such as in a plasma enhanced chemical vapor deposition chamber, a plasma cloud of a reactant gas or gases is formed over a wafer positioned in a chamber such that deposition of a chemical substance can occur on the wafer. During any processing step, the wafer must also be kept in an extremely clean environment without the danger of being contaminated. The processing of a wafer therefore must be conducted in a hermetically sealed environment that is completely isolated from the atmosphere. Numerous processing equipment has been designed for such purpose. One of such widely used equipment is marketed by the Applied Materials Corporation of Santa Clara, Calif., i.e., Centura® 5000 system.

In a Centura® 5000 wafer handling system, as shown in FIG. 1, the basic system 10 consists of two independent vacuum cassette loadlocks 12 and 14, a capacity for one to four independent process chambers (two of such chambers 16 and 18 are shown in FIG. 1), a capacity for two service chambers, including the cool-down chamber 22, and a vacuum transfer chamber 20 which is isolated from vacuum cassette load locks 12, 14 and process chambers 16, 18 by slit valves 32 (shown in FIG. 3). The modular design of the basic system 10 is such that up to three high-temperature silicon deposition chambers may be used as the process chambers. The basic system 10 can be used for fully automatic high-throughput processing of wafers by utilizing a magnetically coupled robot. The basic system 10 is further capable of transferring wafers maintained at a high temperature such as 700° C. The basic system 10 further allows cross-chamber pressure equalization and through-the-wall factory installation. The vacuum pumps for the process chambers 16, 18, the transfer chamber 20 and the cassette loadlocks 12, 14 are mounted at a remote location to prevent mechanical vibration from affecting the operation of the system.

Each of the vacuum cassette loadlocks 12, 14 and the process chambers 16, 18 and the service chamber 22 are bolted to the vacuum transfer chamber 20 and are self-aligned for ease of expansion or modification. Each of the process chambers 16, 18 is capable of processing a single wafer for achieving wafer-to-wafer repeatability and control. The temperatures in the process chambers 16, 18 are further closed-loop controlled for accuracy.

A plane view of the basic system 10 of FIG. 1 is shown in FIG. 2. An enlarged, perspective view of the vacuum transfer chamber 20 is further shown in FIG. 3. As shown in FIG. 3, the process chambers 16, 18 communicate with the vacuum transfer chamber 20 by slit valves 32. Similarly, the vacuum cassette loadlocks 12, 14 and the service chamber 22 (such as the cool-down chamber) communicate with the vacuum transfer chamber 20 through slit valves 32.

In the basic wafer processing system 10 shown in FIGS. 1 and 2, the handling of wafers between the various loadlock chambers 12, 14, the process chambers 16, 18 and the cool-down chamber 22 must be carefully conducted to avoid damage to the wafers. To accomplish such purpose, the wafer is handled by a wafer transfer system 24. The wafer transfer system 24, as shown in FIGS. 2, 3 and 4, consists mainly of a robotic handler which handles all wafer transfers by a single, planar, two-axis, random access, cassette-to-cassette motion. A magnetically coupled robot permits good vacuum integrity and service without interrupting chamber integrity. The major component of the wafer transfer system 24 is the quartz robot blade 28, The high-purity quartz blade 28 permits high-temperature transfer at up to 700° C. without incurring contamination. A non-contact optical wafer centering process is also performed during the wafer transfer process. A constant flow of filtered inert gas such as nitrogen is used in the cassette loadlocks 12, 14 and the vacuum transfer chamber 20. An enlarged view of the wafer transfer system 24 including the quartz robot blade 28 is shown in FIG. 4. A frog-leg-type robot arm 34 is used to operate the quartz robot blade 28.

A conventional quartz robot blade 28 is shown in both a cross-sectional view in FIG. 5A and in a plane view in FIG. 5B. The robot blade 28 can be fabricated of a high temperature ceramic material such as quartz. The blade is provided with mounting holes 36 for mounting to a blade mount 38 (shown in FIG. 4). The quartz robot blade 28 normally has an elongated construction in a rectangular shape. The elongated body 40 consists of an aperture 42 provided for ventilation of the backside of a wafer (not shown), a recessed surface area 44 and three raised peripheral areas 46, 48 and 50. The first raised peripheral area 46 has a maximum diameter measured across the elongated body 40 of approximately 200 mm adapted for receiving an 8-inch wafer. The second raised peripheral area 48 acts as a cradle for holding an 8-inch wafer therein on top of the first raised peripheral area 46.

Since the robot blade 28 is fabricated of a high temperature resistant ceramic material such as quartz which has a smooth surface, problem occurs when the blade is used for transporting a silicon wafer which also has a smooth surface. The positioning of a wafer on the blade 28 resulting in two smooth surfaces being positioned face-to-face and the wafer is frequently lost by slipping off the blade during transport. When a wafer falls off the blade 28, the wafer may be either severely damaged or broken resulting in a total loss. A quartz robot blade that has a smooth top surface for engaging a wafer is therefore inadequate for transporting wafers.

It is therefore an object of the present invention to provide a wafer-transporting apparatus that does not have the drawbacks or shortcomings of the conventional wafer-transporting devices.

It is another object of the present invention to provide an apparatus for transporting semiconductor substrates which is constructed of a rectangular-shaped member that has a top surface with a surface roughness for engaging and holding a substrate thereon.

It is a further object of the present invention to provide an apparatus for transporting wafers which is equipped with a surface roughness in a top surface for engaging a wafer wherein the surface roughness is provided by a sand-blasting method.

It is another further object of the present invention to provide a wafer-transporting blade for transporting wafers into process chambers wherein the blade is fabricated of a quartz material.

It is still another object of the present invention to provide a wafer-transporting blade that is fabricated of a quartz material which has a top surface with a surface roughness formed by fusing a multiplicity of silica sand particles to the surface.

It is yet another object of the present invention to provide a wafer-transporting blade that has a surface roughness on a top surface for engaging wafers wherein the surface roughness is provided by a mechanical abrasion method.

It is still another further object of the present invention to provide a wafer-transporting blade that has a surface roughness on a top surface for engaging wafers wherein the surface roughness is provided by a chemical etching method.

It is yet another further object of the present invention to provide a method for transporting wafers to a process chamber by utilizing a wafer-transporting blade which has a surface roughness in a top surface formed mechanically or chemically such that the top surface frictionally engaging a wafer that is placed on top.

SUMMARY OF THE INVENTION

In accordance with the present invention, an apparatus and a method for transporting substrates to a process chamber are provided.

In a preferred embodiment, an apparatus for transporting substrates is provided which includes a rectangular-shaped member that has a top surface for engaging and holding a substrate thereon, the top surface has at least partially a surface roughness sufficiently great to prevent a substrate held thereon from slipping off the surface.

The apparatus for transporting substrate may be a robot blade for a wafer process chamber that is fabricated of quartz. When the apparatus is a quartz robot blade, the surface roughness may be formed by a multiplicity of fused sand particles. The surface roughness may also be formed of a grooves that are at least 100 $\mu$m apart. The surface roughness may also be formed of grooves that are between 100 $\mu$m and 1000 $\mu$m apart. The grooves may be advantageously provided by a mechanical abrasion method or by a chemical etching method. The apparatus may also be a robot blade that is fabricated of a ceramic or a metallic material. The top surface of the blade may have a raised portion provided with a surface roughness sufficiently great to frictionally engaging a substrate positioned thereon without slippage.

In another preferred embodiment, a wafer-transporting blade for transporting wafers into a process chamber is provided which includes a generally elongated blade member that has a top surface for engaging and holding a wafer securely thereon, at least a portion of the top surface is provided with a surface roughness sufficiently great to frictionally engaging a wafer positioned thereon without slippage.

A portion of the top surface may be raised to a higher plane than the remainder of the top surface and the raised portion may be provided with a surface roughness sufficiently great to frictionally engaging a wafer positioned thereon. The blade may be a robot blade used in a rapid thermal processing chamber. The generally elongated blade member may be a rectangular-shaped member. The surface roughness may be provided by fusing a multiplicity of silica sand particles to a blade that is made of quartz. The surface roughness may be provided by grooves which are at least 0.1 mm apart. The surface roughness may be formed by mechanical means or by chemical means.

The present invention is further directed to a method for transporting wafers to a process chamber that includes the steps of providing a wafer-transporting blade of elongated shape which has a top surface, at least a portion of the top surface is provided with a surface roughness that is sufficiently great to frictionally engaging a wafer without slippage, positioning a wafer on the top surface of the wafer-transporting blade supported at least partially by the portion of the top surface that has the surface roughness, and moving the wafer-transporting blade into a process chamber and disengaging the wafer carried on top.

The method for transporting wafers to a process chamber may further include the step of providing the surface roughness by a mechanical method or by a chemical method. The method may further include the step of providing the surface roughness by fusing a multiplicity of silicate sand particles to a wafer-transporting blade made of quartz. The surface roughness may be formed of grooves that are between 0.1 mm and 1 mm apart. The surface roughness may be formed by a chemical etching method or by a mechanical abrasion method.

BRIEF DESCRIPTION OF THE DRAWINGS

These and other objects, features and advantages of the present invention will become apparent from the following detailed description and the appended drawings in which:

FIG. 5A is an enlarged, cross-sectional view of a conventional quartz robot blade.

FIG. 5B is an enlarged, plane view of the conventional quartz robot blade.

FIG. 6A is an enlarged, cross-sectional view of a present invention quartz robot blade.

FIG. 6B is an enlarged, plane view of the present invention quartz robot blade.

DETAILED DESCRIPTION OF THE PREFERRED EMBODIMENT

Figure 1:
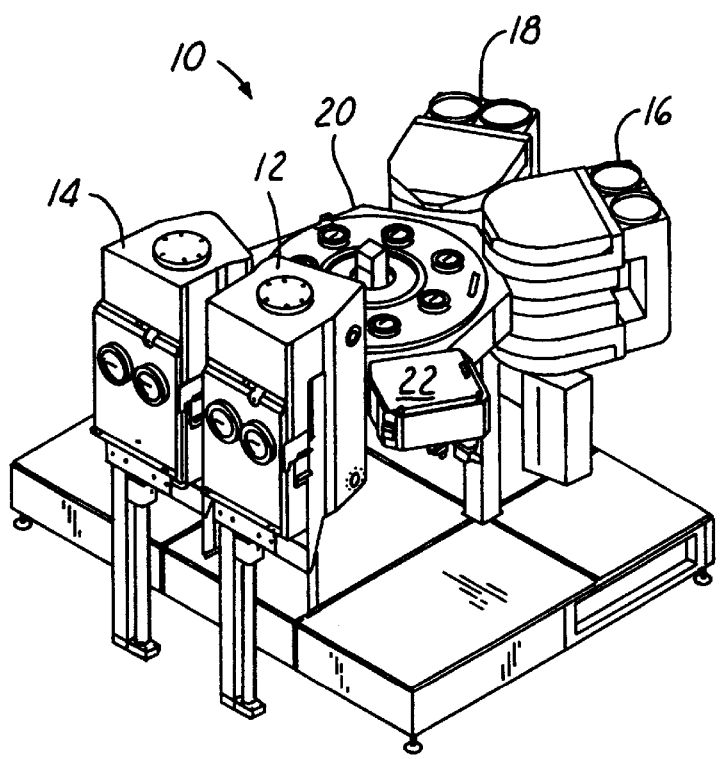
FIG. 1 is a perspective view of a basic wafer handling system for semiconductor processing.
Figure 2:
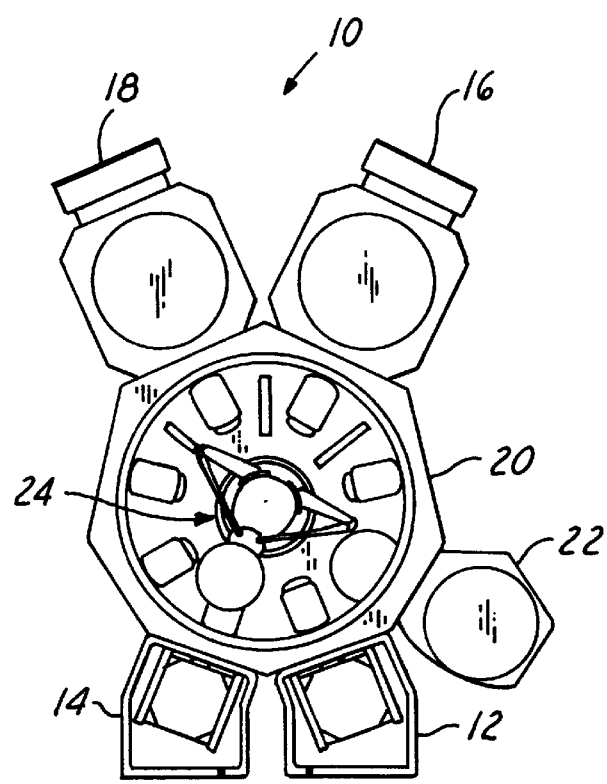
FIG. 2 is a plane view of the basic wafer handling system of FIG. 1.
Figure 3:
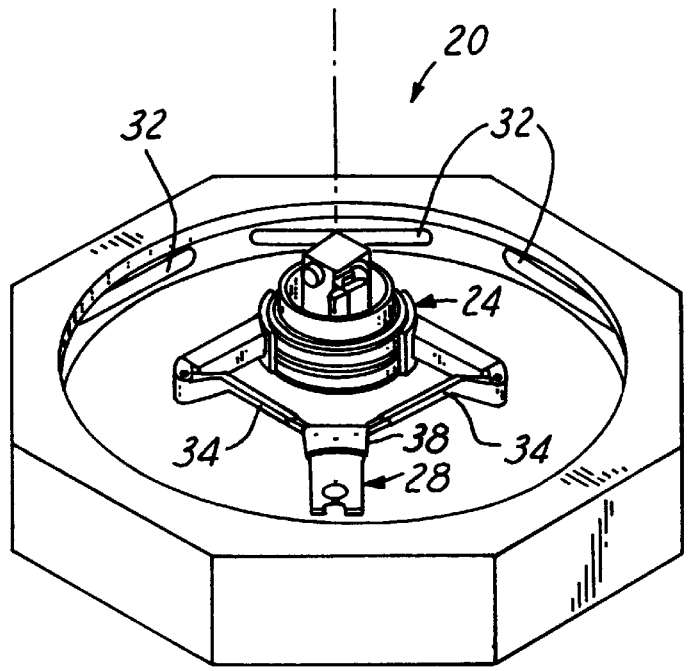
FIG. 3 is a perspective view of the vacuum transfer chamber of the basic system.
Figure 4:
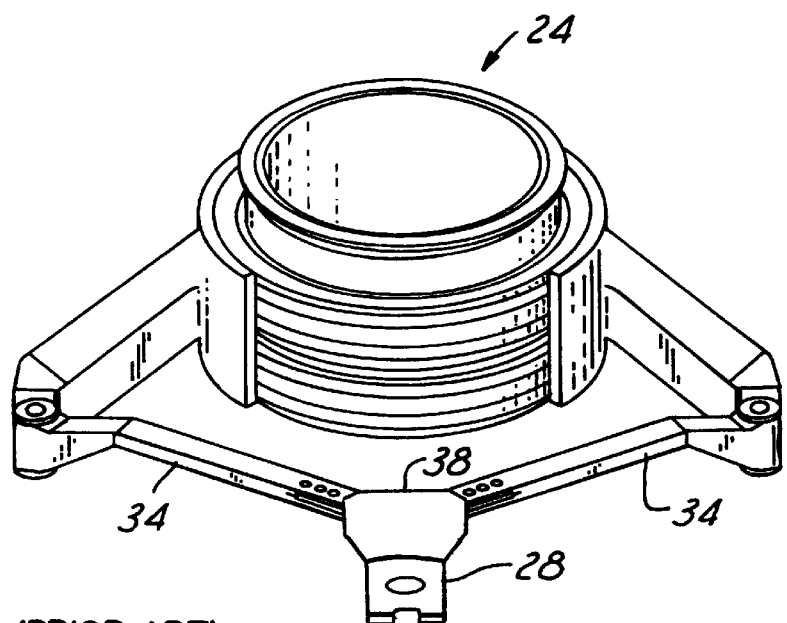
FIG. 4 is a perspective view of a wafer transfer system including a robot blade.

The present invention discloses an apparatus and a method for transporting wafers into a processing chamber by utilizing a generally rectangular-shaped quartz robot blade that has a top surface and at least a portion of the top surface has a surface roughness that is sufficient great to prevent a wafer positioned thereon from slipping off the surface. The present invention novel apparatus can be advantageously used in a basic wafer handling system for wafer processing, i.e., to transport wafers between vacuum cassette loadlock stations, vacuum transfer chamber, independent process chambers and service chambers such as cool down chambers. The quartz robot blade that has a surface roughness in a top surface for engaging wafers can be used in a hermetically sealed environment of either high vacuum or of a hostile chemical atmosphere.

Referring now to FIG. 6A wherein an enlarged, cross-sectional view of the present invention quartz robot blade 60 is shown. An enlarged, plane view of the present invention quartz robot blade 60 is shown in FIG. 6B. The quartz robot blade 60 has a recessed top surface 62, surrounded at two ends by two raised peripheral portions 64, 66. Further raised portions 68, 72 surround the raised portions 64, 66. A still further raised portion 74 is provided at one end of the blade 60 for mounting to a robotic arm (not shown) through mounting holes 76. A distance measured between the arcuate surfaces 82, 84, as indicated by X in FIG. 6, is 200 mm for holding an 8-inch diameter wafer. The first raised areas 64 and 66 are higher than the recessed area 62 by approximately 0.3 mm. The first raised areas 64, 66 in arcuate shape are provided with a surface roughness that is sufficiently great for preventing a wafer positioned on top of the blade 60 from slipping off. It should be noted that, while in FIG. 6B, grooves are shown in the arcuate areas 64, 66, the surface roughness may be provided in various forms.

A method frequently used to provide the surface roughness is by sand-blasting a quartz surface with fine silica sand particles such that the particles stick to the quartz for forming a rough surface. The method can be easily carried out by shielding other parts of the quartz robot blade 60 such that they are not subjected to sand-blasting. Only the first raised portions 64, 66 are exposed for a multiplicity of silica sand particles to be fused thereto. An aperture 78 is provided for ventilation of the backside of the wafer when a wafer is positioned on the blade 60. The second raised portions 68, 72 provide a cradle for holding a wafer securely therein when positioned on top of the blade 60. A notch 86 is further provided at the tip portion of the blade 60 for ease of loading wafers.

The surface roughness provided on the first raised portions 64, 66 for providing frictional engagement with a wafer surface may be advantageously provided by a sand-blasting method as previously described, or provided by other suitable methods. For instance, grooves on a top surface of the raised portions 64, 66 may be provided by a mechanical abrasion method or by a chemical etching method. A suitable pattern for the grooves may have 100 $\mu$m distance between the grooves. The distance between the grooves may be suitably selected in a range between about 100 $\mu$m (0.1 mm) and about 1000 $\mu$m (1 mm). Any suitable mechanical abrasion method for forming a surface roughness may be utilized, for instance, by using a diamond abrasive disc or a diamond abrasive paper.

It should be noted that another advantage provided by the present invention quartz robot blade is that the thickness of the blade may be reduced when compared to a conventional blade. The present invention blade has a thickness of about 1.5 mm in the recessed portion when compared to 2.4 mm for a conventional blade. The thickness of the tip portion is about 2.4 mm when compared to 3.12 mm for a conventional blade. The smaller thickness of the present invention quartz robot blade provides the advantage that the changes of accidental collision of a blade with a wafer stored in a wafer cassette can be drastically reduced. Such collision when occurred frequently cause the breakage of a wafer and results in severe yield loss.

The present invention novel method for transporting wafers to a process chamber may be carried out by the operating steps of first providing a wafer-transporting blade of elongated shape that has a top surface, at least a portion of the top surface is provided with a surface roughness sufficiently great for frictionally engaging a wafer without slippage, then positioning a wafer on the top surface of the wafer-transporting blade supported at least partially by the portion of the top surface that has the surface roughness, and then moving the wafer-transporting blade into a process chamber and disengaging the wafer carried on top.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for transporting substrates comprising:
   a generally rectangular-shaped member having a recessed top surface for engaging and holding a substrate thereon,
   the recessed top surface being surrounded at two ends by two first raised peripheral portions and two second raised peripheral portions surround the first raised peripheral portions,
   the first raised peripheral portions being provided with a surface roughness sufficiently great to prevent a substrate held thereon from slipping off the surface when the substrate-transporting member is moved into a process chamber.

2. An apparatus for transporting wafers according to claim 1, wherein said apparatus is a robot blade for a wafer processing chamber.

3. An apparatus for transporting wafers according to claim 1, wherein said apparatus is a robot blade fabricated of quartz.

4. An apparatus for transporting wafers according to claim 1, wherein said apparatus is a quartz robot blade and said surface roughness is formed by a multiplicity of fused sand particles.

5. An apparatus for transporting wafers according to claim 1, wherein said surface roughness is formed of grooves that are at least 100 $\mu$m apart.

6. An apparatus for transporting wafers according to claim 1, wherein said surface roughness is formed of grooves that are between 100 $\mu$m and 1000 $\mu$m apart.

7. An apparatus for transporting wafers according to claim 1, wherein said surface roughness is formed of grooves that are provided by mechanical abrasion means.

8. An apparatus for transporting wafers according to claim 1, wherein said surface roughness is formed of grooves that are provided by chemical etching means.

9. An apparatus for transporting wafers according to claim 1, wherein said apparatus is a robot blade fabricated of a ceramic or a metallic material.

10. A wafer-transporting blade for transporting wafers into a process chamber comprising:
    a generally elongated blade member having a top recessed surface for engaging and holding a wafer securely thereon, the recessed top surface being surrounded at two ends by two firsts raised peripheral portions and two second raised peripheral portions surrounding the first raised peripheral portions the first raised peripheral portions being provided with a surface roughness formed by a multiplicity of fused sand particles or by a multiplicity of linear grooves for frictionally engaging a wafer positioned thereon without slippage.

11. A wafer-transporting blade for transporting wafers into a process chamber according to claim 10, wherein said blade is a robot blade for a rapid thermal processing chamber.

12. A wafer-transporting blade for transporting wafers into a process chamber according to claim 10, wherein said generally elongated blade is a rectangular-shaped, member.

13. A wafer-transporting blade for transporting wafers into a process chamber according to claim 10, wherein said surface roughness is provided by fusing a multiplicity of sand particles to a blade made of quartz.

14. A wafer-transporting blade for transporting wafers into a process chamber according to claim 10, wherein said blade is fabricated of a ceramic material.

15. A wafer-transporting blade for transporting wafers into a process chamber according to claim 10, wherein said surface roughness being formed of grooves that are at least 0.1 mm apart.

16. A wafer-transporting blade for transporting wafers into a process chamber according to claim 10, wherein said surface roughness being formed by mechanical means.

17. A wafer-transporting blade for transporting wafers into a process chamber according to claim 10, wherein said surface roughness being formed by chemical means.

* * * * *